(12) United States Patent
Kinoshita

(10) Patent No.: US 7,626,235 B2
(45) Date of Patent: Dec. 1, 2009

(54) NAND NONVOLATILE SEMICONDUCTOR MEMORY DEVICE AND METHOD OF MANUFACTURING NAND NONVOLATILE SEMICONDUCTOR MEMORY DEVICE

(75) Inventor: Hideyuki Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 11/812,830

(22) Filed: Jun. 22, 2007

(65) Prior Publication Data
US 2008/0002470 A1  Jan. 3, 2008

(30) Foreign Application Priority Data
Jun. 28, 2006  (JP)  ............... 2006-177753

(51) Int. Cl.
*H01L 29/76* (2006.01)
*H01L 29/94* (2006.01)

(52) U.S. Cl. ............ 257/390; 257/396; 257/397; 257/E29.17

(58) Field of Classification Search ......... 257/390, 257/396, 397, E29.17
See application file for complete search history.

(56) References Cited

U.S. PATENT DOCUMENTS

| 7,521,749 | B2* | 4/2009 | Arai et al. | 257/316 |
| 7,541,240 | B2* | 6/2009 | Pham et al. | 438/257 |
| 7,554,149 | B2* | 6/2009 | Kim | 257/315 |
| 2006/0097307 | A1 | 5/2006 | Sato et al. | |
| 2007/0284649 | A1* | 12/2007 | Iwasawa | 257/321 |
| 2008/0175038 | A1* | 7/2008 | Arimoto et al. | 365/149 |
| 2009/0039409 | A1* | 2/2009 | Yaegashi | 257/316 |
| 2009/0081838 | A1* | 3/2009 | Endo | 438/264 |

FOREIGN PATENT DOCUMENTS

JP  2002-176114  6/2002

* cited by examiner

*Primary Examiner*—Ngan Ngo
(74) *Attorney, Agent, or Firm*—Finnegan, Henderson, Farabow, Garrett & Dunner, L.L.P.

(57) ABSTRACT

A NAND nonvolatile semiconductor memory device that has a memory cell array region and a selection gate region, has a semiconductor layer; a gate insulating film disposed on said semiconductor layer; a plurality of first electrode layers selectively disposed on said gate insulating film; a first device isolation insulating film formed in said memory cell array region and extends from between said adjacent first electrode layers into said semiconductor layer for device isolation; a second device isolation insulating film formed in said selection gate region and extends from between said adjacent first electrode layers into said semiconductor layer for device isolation; an interpoly insulating film formed at least on the top of said first electrode layers and said first device isolation insulating film in said memory cell array region; a second electrode layer disposed on said interpoly insulating film; and a third electrode layer disposed on said second electrode layer, said second device isolation insulating film and the first electrode layers in said selection gate region, wherein the height of the top surface of said second device isolation insulating film is greater than the height of the top surface of said first device isolation insulating film.

4 Claims, 22 Drawing Sheets

NAND NONVOLATILE SEMICONDUCTOR MEMORY DEVICE AND METHOD OF MANUFACTURING NAND NONVOLATILE SEMICONDUCTOR MEMORY DEVICE

CROSS-REFERENCE TO RELATED APPLICATION

This application is based upon and claims the benefit of priority from the prior Japanese Patent Application No. 2006-177753, filed on Jun. 28, 2006, the entire contents of which are incorporated herein by reference.

BACKGROUND OF THE INVENTION

1. Field of the Invention

The present invention relates to a NAND nonvolatile semiconductor memory device that has a memory cell array region and a selection gate region, and a method of manufacturing a NAND nonvolatile semiconductor memory device.

2. Background Art

In recent years, the microfabrication technique for semiconductor devices has advanced, and a minimum feature size of 50 nm or smaller has been achieved.

As for a NAND nonvolatile semiconductor memory device (NAND flash memory), interference between adjacent memories due to the coupling capacitance thereof becomes more significant as the miniaturization proceeds. In addition, the difficulty of machining significantly increases as the miniaturization proceeds, so that reducing the vertical size of the NAND flash memory (reducing the thickness of the film structure) has become an important issue.

Many conventional flash memories in practical use have a memory cell structure including a floating gate. In the case where the selection gate is formed at the same time as the control gate, the interpoly insulating film is partially removed to make the control gate and the floating gate electrically continuous (see Japanese Patent Laid-Open Publication No. 2002-176114, for example).

To achieve desired characteristics, the thickness of the device isolation insulating film between the Poly-Si layer serving as the control gate and the channel region (silicon substrate surface) has to be sufficiently greater than the thickness of the gate insulating film.

However, due to fluctuation in the process of partially removing the interpoly insulating film described above, the device isolation insulating film can be excessively etched. In that case, the Poly-Si layer serving as the control gate and the channel region are excessively close to each other. As a result, a problem can arise that the yield decreases because the withstand voltage of the selection gate decreases, the leak current increases, or the operating threshold voltage varies, for example.

SUMMARY OF THE INVENTION

According one aspect of the present invention, there is provided: a NAND nonvolatile semiconductor memory device that has a memory cell array region and a selection gate region, comprising a semiconductor layer; a gate insulating film disposed on said semiconductor layer; a plurality of first electrode layers selectively disposed on said gate insulating film; a first device isolation insulating film formed in said memory cell array region and extends from between said adjacent first electrode layers into said semiconductor layer for device isolation; a second device isolation insulating film formed in said selection gate region and extends from between said adjacent first electrode layers into said semiconductor layer for device isolation; an interpoly insulating film formed at least on the top of said first electrode layers and said first device isolation insulating film in said memory cell array region; a second electrode layer disposed on said interpoly insulating film; and a third electrode layer disposed on said second electrode layer, said second device isolation insulating film and the first electrode layers in said selection gate region, wherein the height of the top surface of said second device isolation insulating film is greater than the height of the top surface of said first device isolation insulating film.

According another aspect of the present invention, there is provided: a method of manufacturing a NAND nonvolatile semiconductor memory device that involves formation of a control gate and a floating gate in a memory cell array region and a selection gate in a selection gate region of the NAND nonvolatile semiconductor memory device, comprising forming a gate insulating film on a semiconductor layer; forming a first electrode layer on said gate insulating film; forming a first device isolation insulating film in said memory cell array region and a second device isolation insulating film in said selection gate region, respectively, by a STI technique in such a manner that the first and second device isolation insulating films penetrate through said first electrode layer and said gate insulating film into said semiconductor layer; selectively etching the top surface of said first device isolation insulating film; forming an interpoly insulating film on said first device isolation insulating film, said second device isolation insulating film and the exposed surface of the first electrode layer after selectively etching the top surface of said first device isolation insulating film; forming a second electrode layer on said interpoly insulating film; selectively etching said second electrode layer and said interpoly insulating film in said selection gate region, thereby exposing the top surface of said second device isolation insulating film and the top surface of said first electrode layer; forming a third electrode layer on said second electrode layer, said second device isolation insulating film, and said first electrode layer; and selectively removing said first electrode layer, said interpoly insulating film, said second electrode layer and said third electrode layer, thereby forming said control gate and said floating gate in said memory cell array region and said selection gate in said selection gate region.

DETAILED DESCRIPTION

In the following, embodiments of the present invention will be described with reference to the drawings.

FIRST EMBODIMENT

Figure 1A:
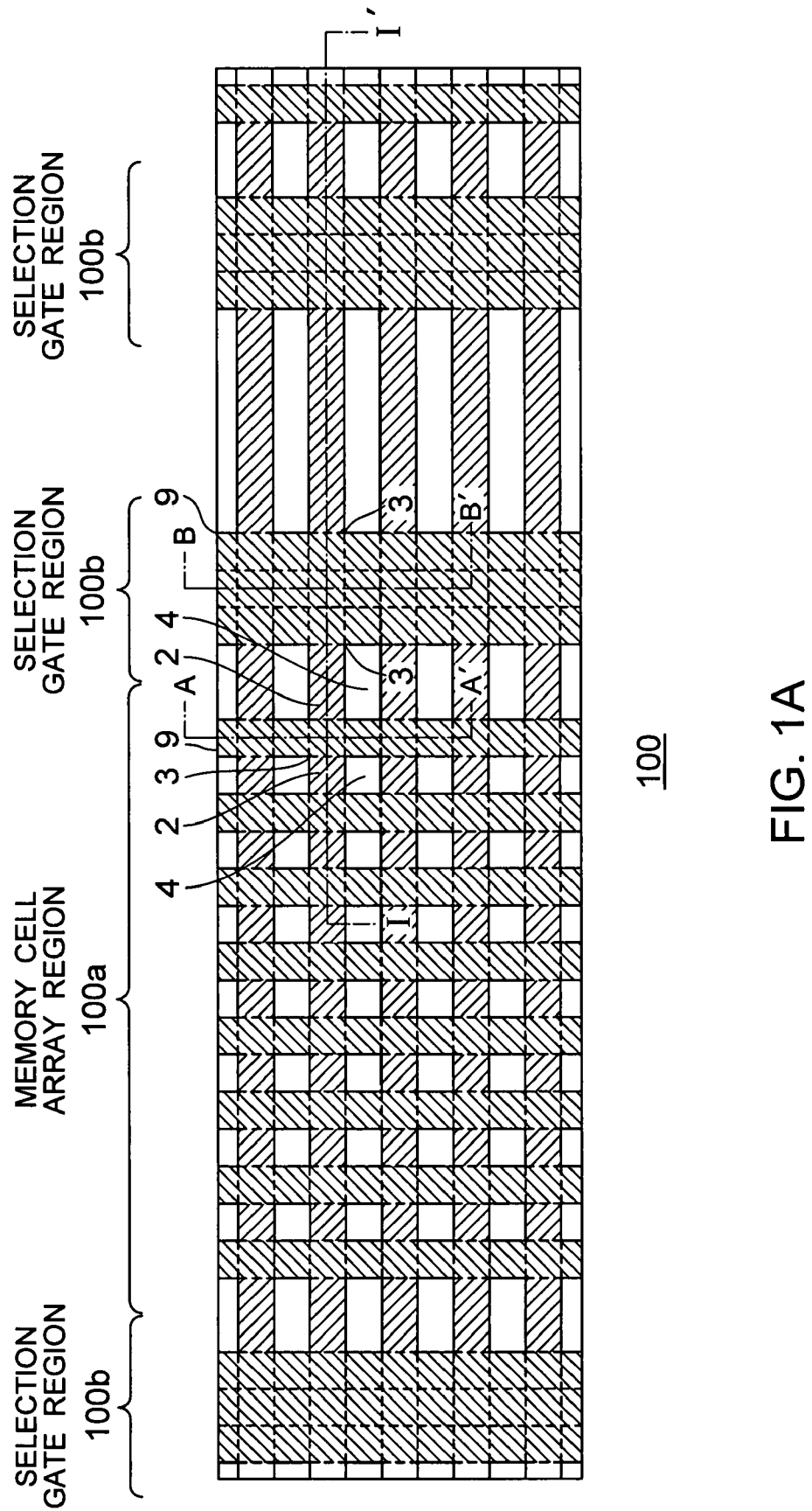
FIG. 1A is a top view showing a configuration of essential components of a NAND nonvolatile semiconductor memory device according to a first embodiment of the present invention.
Figure 1B:
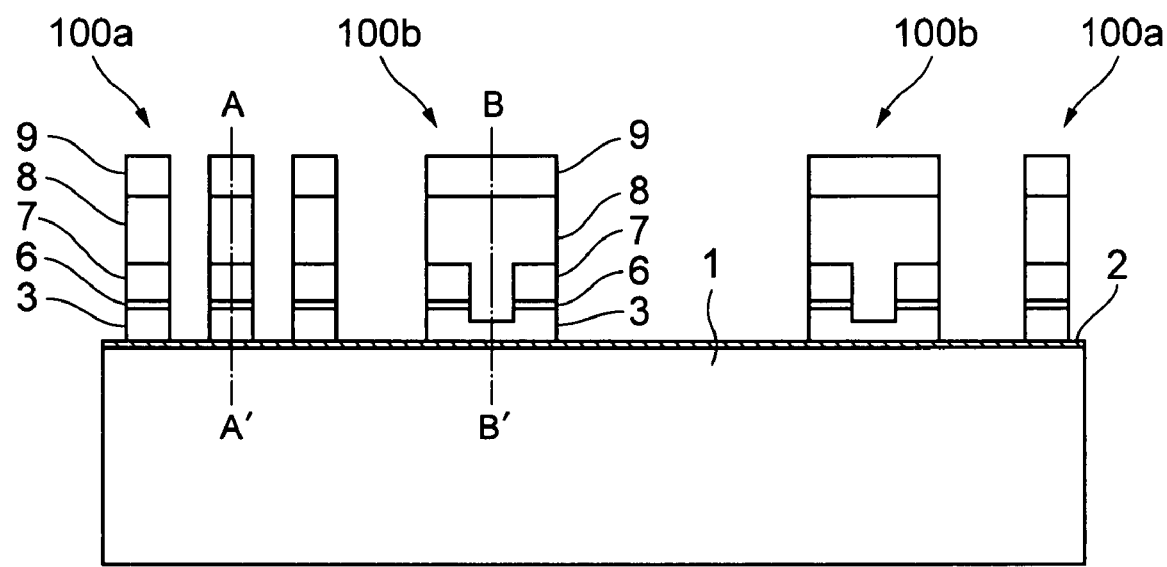
FIG. 1B is a cross-sectional view of the NAND nonvolatile semiconductor memory device taken along the line I-I' in FIG. 1A.
Figure 1C:
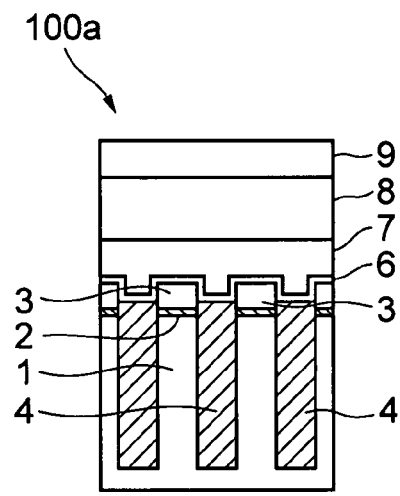
FIG. 1C is a cross-sectional view of the NAND nonvolatile semiconductor memory device taken along the line A-A' in FIG. 1B.
Figure 1D:
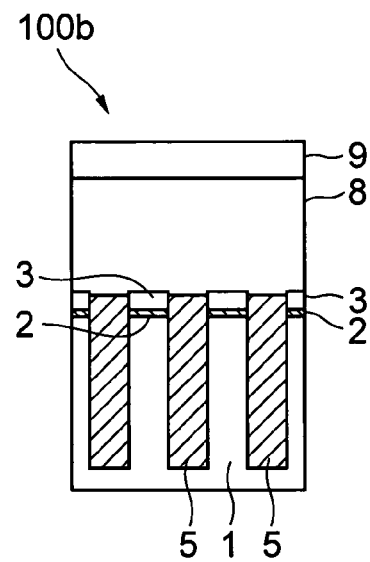
FIG. 1D is a cross-sectional view of the NAND nonvolatile semiconductor memory device taken along the line B-B' in FIG. 1B.
Figure 1E:
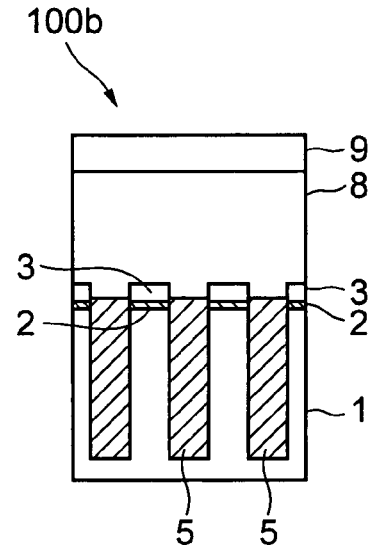
FIG. 1E is a cross-sectional view of the NAND nonvolatile semiconductor memory device taken along the line B-B' in FIG. 1B.

FIG. 1A is a top view showing a configuration of essential components of a NAND nonvolatile semiconductor memory device according to a first embodiment of the present invention. FIG. 1B is a cross-sectional view of the NAND nonvolatile semiconductor memory device taken along the line I-I' in FIG. 1A. FIG. 1C is a cross-sectional view of the NAND nonvolatile semiconductor memory device taken along the line A-A' in FIG. 1B. FIGS. 1D and 1E are cross-sectional views of the NAND nonvolatile semiconductor memory device taken along the line B-B' in FIG. 1B.

For the sake of simplicity, in FIGS. 1A to 1D, illustration of an interlayer insulating film, contact wiring in the interlayer insulating film, wiring on the interlayer insulating film connected to the contact wiring, and the like is omitted.

As shown in FIG. 1A, a NAND nonvolatile semiconductor memory device (NAND flash memory) 100 has a memory cell array region 100a that includes control gates arranged side by side and floating gates arranged in a matrix, and a selection gate region 100b that has arranged close to an edge of the memory cell array region 100a in parallel with the control gates.

As shown in FIGS. 1B to 1D, the NAND nonvolatile semiconductor memory device 100 has a semiconductor layer 1, a gate insulating film 2 formed on the semiconductor layer 1, and a plurality of first electrode layers 3 selectively formed on the gate insulating film 2.

For example, in a NAND flash memory, the gate insulating film 2 serves as a tunnel oxide film.

The first electrode layer 3 is a polysilicon layer doped with phosphor, for example.

The NAND nonvolatile semiconductor memory device 100 further has first device isolation insulating films 4 that are formed in the memory cell array region 100a and extend from between adjacent first electrode layers 3 into the semiconductor layer 1 for device isolation, and second device isolation insulating films 5 that are formed in the selection gate region 100b and extend from between adjacent first electrode layers 3 into the semiconductor layer 1 for device isolation.

The NAND nonvolatile semiconductor memory device 100 further has an interpoly insulating film 6 formed on the first electrode layers 3 and the first device isolation insulating films 4 in the memory cell array region 100a, a second electrode layer 7 formed on the interpoly insulating film 6, and a third electrode layer 8 formed on the second electrode layer 7, the second device isolation insulating films 5 as well as the first electrode layers 3 in the selection gate region 100b.

In the memory cell array region 100a, the third electrode layer 8 is stacked on and electrically connected to the second electrode layer 7. In the selection gate region 100b, the first electrode layers 3, the second electrode layer 7 and the third electrode layer 8 are stacked one on another and electrically connected to each other.

The second electrode layer 7 and the third electrode layer 8 are polysilicon films doped with phosphor, for example.

The top surface of the second device isolation insulating films 5 is higher than the top surface of the first device isolation insulating films 4. This is intended to allow for a greater tolerance for etching of the second device isolation insulating films 5 in the selection gate region 100b than for etching of the first device isolation insulating films 4 in the memory cell array region 100a, which is performed separately from etching of the second device isolation insulating films 5, as described later.

The first electrode layer 3 in the memory cell array region 100a serves as a floating gate.

The second electrode layer 7 and the third electrode layer 8 in the memory cell array region 100a serve as a control gate.

The first electrode layer 3, the second electrode layer 7 and the third electrode layer in the selection gate region serve as a selection gate.

For example, a contact hole is formed in the interlayer insulating film (not shown), and wiring (not shown) to be connected to the control gate via the contact hole is formed on the interlayer insulating film. Similarly, wiring to be connected to the selection gate via the contact hole is formed on the interlayer insulating film. The wiring is connected to a peripheral circuit (not shown).

Now, a result of analysis of a relationship between the height of the device isolation insulating films from the top surface of the semiconductor layer in the selection gate region 100b of the NAND nonvolatile semiconductor memory device 100 described above and the device characteristics will be described.

The device characteristics is evaluated based on comparison between the electric capacitance of a pure gate insulating film and that of a structure having device isolation insulating films similar to those in the selection gate region of the NAND nonvolatile semiconductor memory device.

Figure 2A:
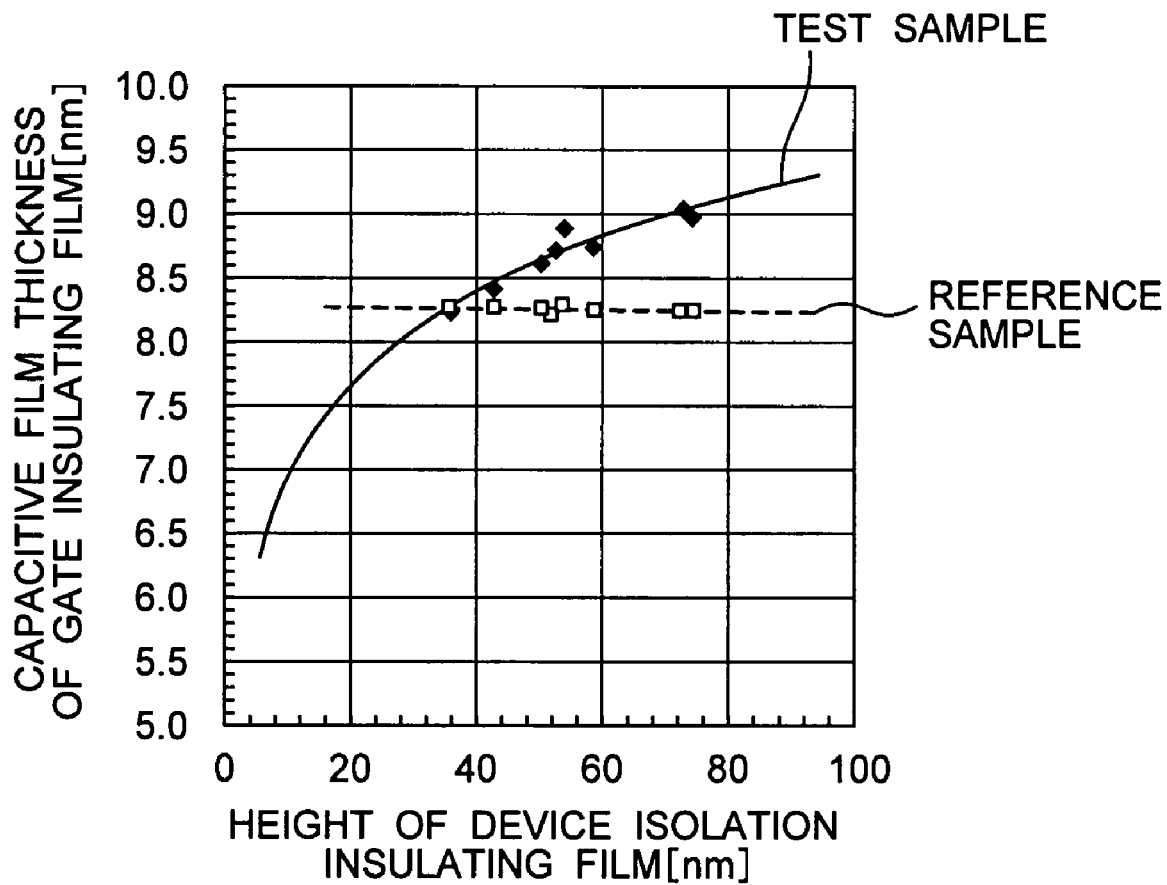
FIG. 2A is a graph showing a relationship between the height of the device isolation insulating films and the capacitive film thickness of the gate insulating film.
Figure 2B:
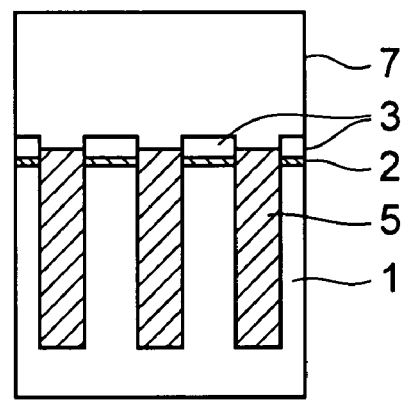
FIG. 2B is a cross-sectional view (ideal) of a test sample.
Figure 2C:
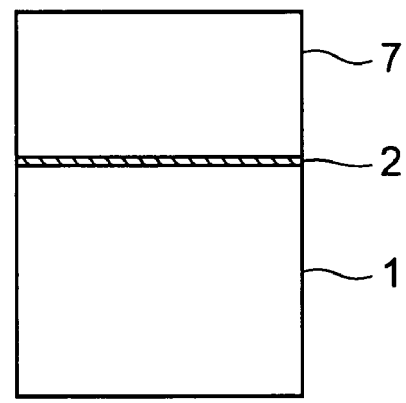
FIG. 2C is a cross-sectional view of a reference sample.

FIG. 2A is a graph showing a relationship between the height of the device isolation insulating films and the capacitive film thickness of the gate insulating film. A plurality of test samples that differ in height of the device isolation insulating films from the top surface of the semiconductor layer are prepared, and the electric capacitance thereof is measured. The test samples have the device isolation insulating films 5 according to this embodiment formed in the semiconductor layer 1, and the gate insulating film 2, the first electrode layers 3 and the second electrode layer 7 formed on the semiconductor layer 1 (FIG. 2B). In addition, a capacitor that is configured not to be affected by the device isolation insulating films on the same wafer is prepared and used as a reference sample. The reference sample is prepared by forming an insulating film (which is the same as the gate insulating film 2) on the semiconductor layer 1 and forming an electrode layer (which is the same as the second electrode layer 7) on the insulating film (FIG. 2C). In FIG. 2A, the height of the device isolation insulating films indicated on the abscissa is measured by scatterometry. The term "capacitive film thickness" refers to the value of the capacitance divided by the area of the gate region.

In the evaluation of the device characteristics, it is supposed that, if the capacitive film thickness of a test sample is equal to or greater than the capacitive film thickness of the reference sample, the device characteristics is not affected thereby, and if the capacitive film thickness of a test sample is smaller than the capacitive film thickness of the reference sample, the device characteristics is affected thereby.

As shown in FIG. 2A, when the height of the device isolation insulating films is 36 nm, and the height of the gate insulating film is about 8 nm, the capacitive film thickness of the reference sample and the capacitive film thickness of the test sample are equal to each other.

Figure 2D:
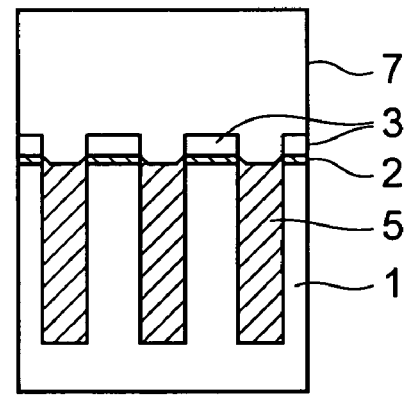
FIG. 2D is a cross-sectional view of the test sample.
Figure 2E:
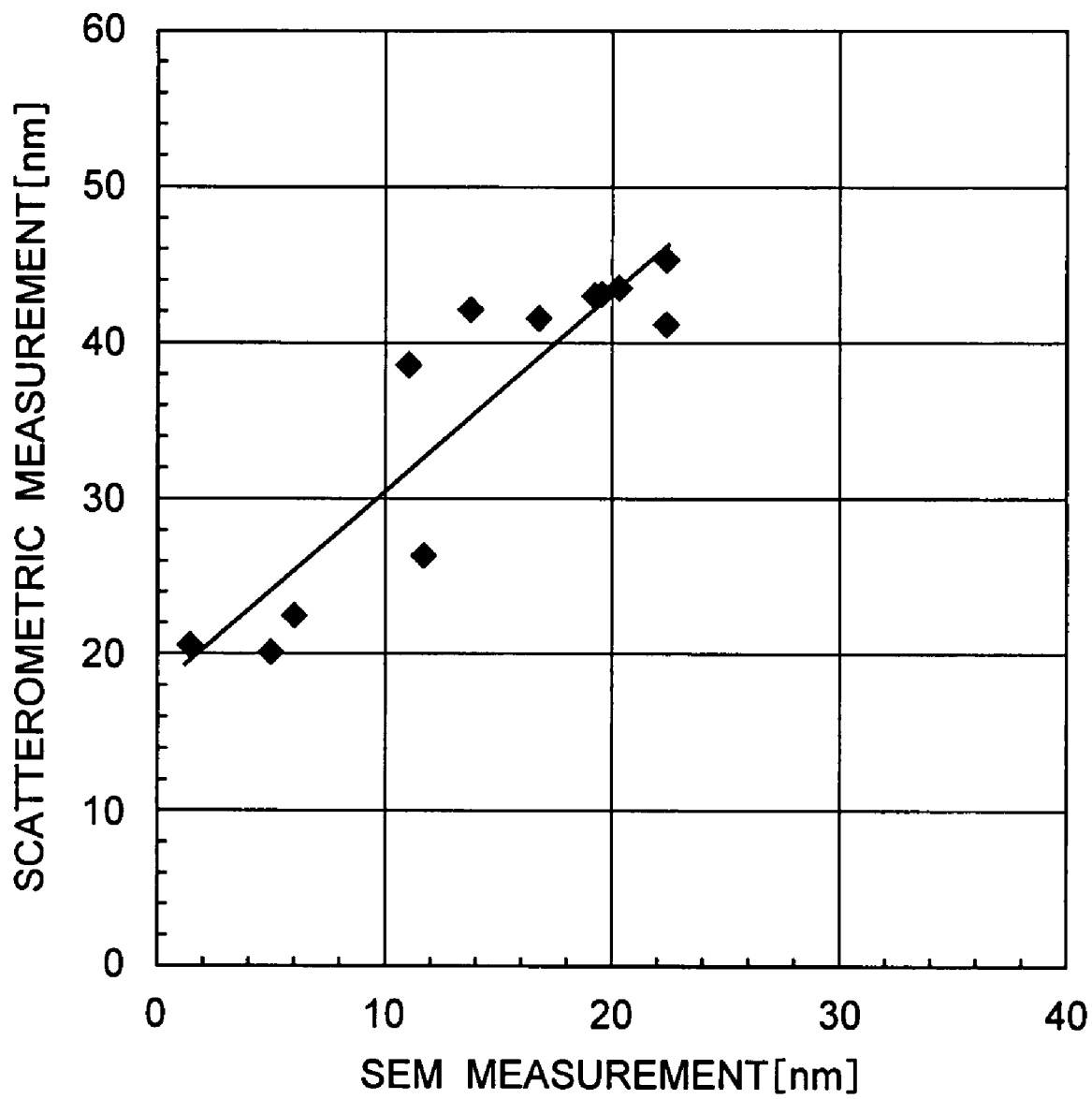
FIG. 2E is a graph showing a relationship between scatterometric measurements of the thickness of the insulating film and SEM measurements of the thickness of the insulating film.

Because the top surface of the device isolation insulating films is not completely flat as shown in FIG. 2D, for example, the scatterometric measurements have to be corrected. FIG. 2E is a graph showing a relationship between scatterometric measurements of the thickness of the insulating film and SEM measurements of the thickness of the insulating film. As shown in FIG. 2E, the scatterometric measurements have to be corrected by subtracting about 20 nm.

Taking the correction into account, when the height of the device isolation insulating films is 16 nm, and the height of the gate insulating film is about 8 nm, the capacitive film thickness of the reference sample and the capacitive film thickness of the test sample are equal to each other. In other words, it can be considered that the lower limit of the height of the device isolation insulating films that does not affect the device is about twice the height of the gate insulating film in the selection gate region.

In addition, taking into account the condition of etching of the interpoly insulating film in the selection gate region in the method of manufacturing the NAND nonvolatile semiconductor memory device described later, the height of the top surface of the device isolation insulating films from the top surface of the semiconductor layer 1 is equal to or lower than the height of the top surface of the first electrode layers 3 in the selection gate region from the top surface of the semiconductor layer 1.

Furthermore, if the height of the device isolation insulating films is made twice or more than twice the height of the gate insulating film in the selection gate region, thereby reducing the effect thereof on the device characteristics, the width of channels between the device isolation insulating films can be reduced. This is because the narrower the channel width of a transistor, the greater the effect of the device isolation insulating films is.

Furthermore, the first electrode layers (polysilicon) serving as floating gates may be thinner. This is because the controllability is improved because the first electrode layers in the memory cell array region and the first electrode layers in the selection gate region are etched separately as described later.

Now, there will be described a method of manufacturing a NAND nonvolatile semiconductor memory device that has control gates in a memory cell array region and selection gates in a selection gate region as described above.

FIGS. 3A to 14A are cross-sectional views taken along the line I-I' in FIG. 1A for illustrating steps of the method of manufacturing the NAND nonvolatile semiconductor memory device 100 according to the first embodiment of the present invention. FIGS. 3B to 14B are cross-sectional views taken along the line A-A' in FIGS. 3A to 14A, respectively, for illustrating the method of manufacturing the NAND nonvolatile semiconductor memory device 100 according to the first embodiment of the present invention. FIGS. 3C to 14C are cross-sectional views taken along the line B-B' in FIGS. 3A to 14A, respectively, for illustrating the method of manufacturing the NAND nonvolatile semiconductor memory device 100 according to the first embodiment of the present invention.

First, a gate insulating film 2 is formed on a semiconductor layer 1, which has been subjected to ion implantation or other treatment in regions that are to be wells or channels of a memory transistor or selection transistor, and a first electrode layer 3 is formed on the gate insulating film 2.

Then, a SiN film 10 is formed on the first electrode layer 3 in a desired device isolation pattern, and then, a first device isolation insulating film 4 is formed in a memory cell array region 100a so that the first device isolation insulating film 4 extends into the semiconductor layer 1 through the first electrode layer 3 and the gate insulating film 2, and a second device isolation insulating film 5 is formed in a selection gate region 100b.

Figure 3A:
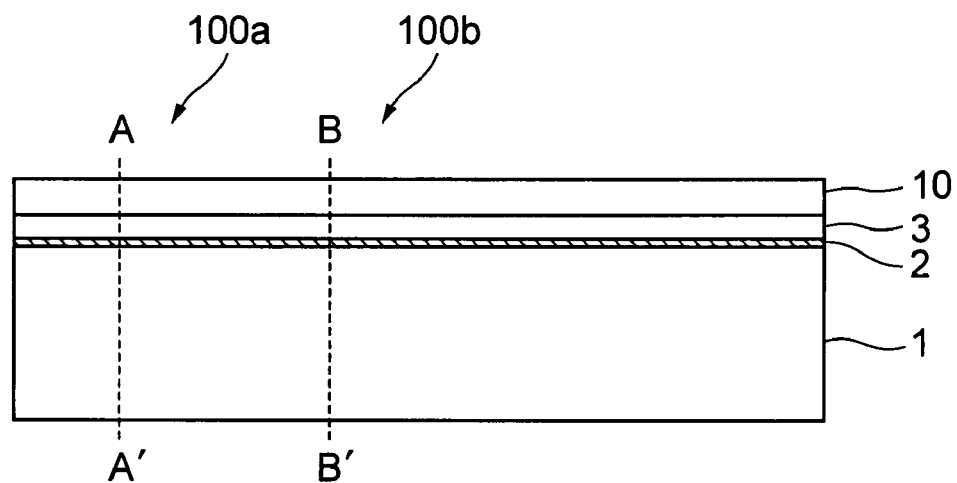
FIG. 3A is a cross-sectional view taken along the line I-I' in FIG. 1A for illustrating steps of the method of manufacturing the NAND nonvolatile semiconductor memory device 100 according to the first embodiment of the present invention.
Figure 3B:
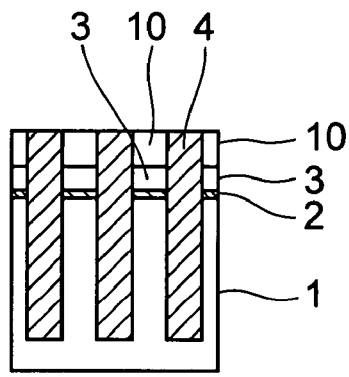
FIG. 3B is a cross-sectional view taken along the line A-A' in FIG. 3A, respectively, for illustrating the method of manufacturing the NAND nonvolatile semiconductor memory device 100 according to the first embodiment of the present invention.
Figure 3C:
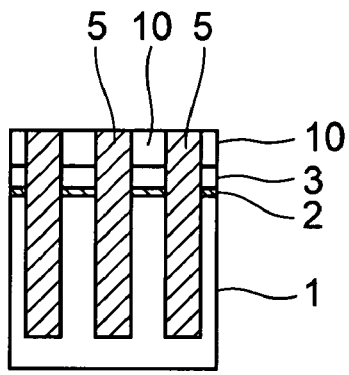
FIG. 3C is a cross-sectional view taken along the line B-B' in FIG. 3A, respectively, for illustrating the method of manufacturing the NAND nonvolatile semiconductor memory device 100 according to the first embodiment of the present invention.

Then, using the SiN film 10 as a stopper, the surface of the SiN film 10 and the first device isolation insulating film 4 are planarized by chemical mechanical polishing (CMP) (FIGS. 3A to 3C).

Figure 4A:
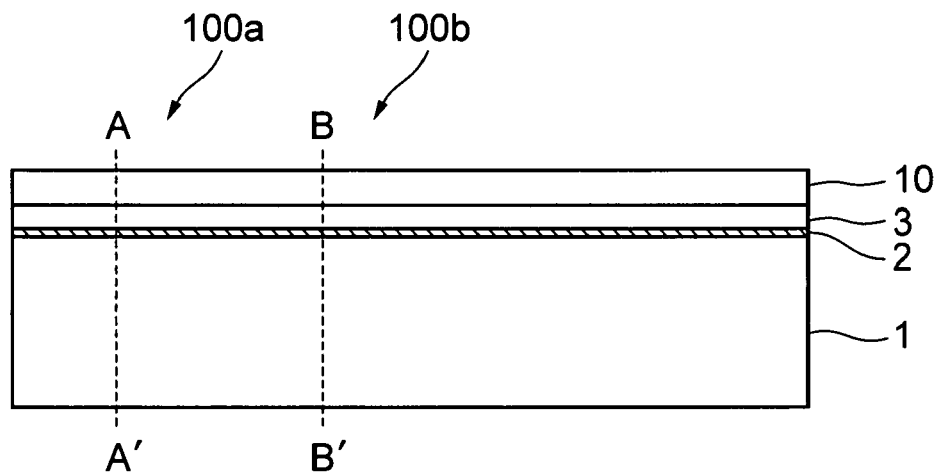
FIG. 4A is a cross-sectional view taken along the line I-I' in FIG. 1A for illustrating steps of the method of manufacturing the NAND nonvolatile semiconductor memory device 100 according to the first embodiment of the present invention.
Figure 4B:
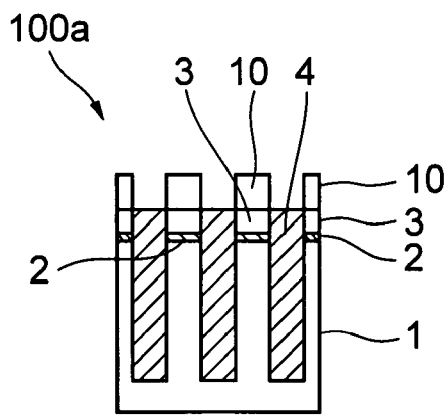
FIG. 4B is a cross-sectional view taken along the line A-A' in FIG. 4A, respectively, for illustrating the method of manufacturing the NAND nonvolatile semiconductor memory device 100 according to the first embodiment of the present invention.
Figure 4C:
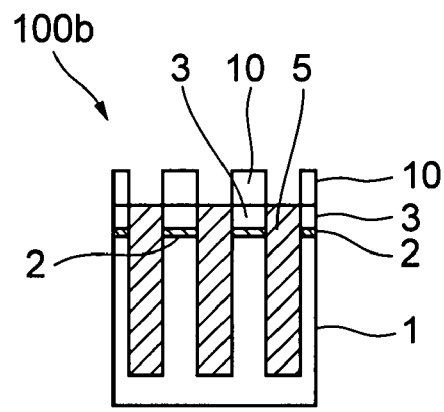
FIG. 4C is a cross-sectional view taken along the line B-B' in FIG. 4A, respectively, for illustrating the method of manufacturing the NAND nonvolatile semiconductor memory device 100 according to the first embodiment of the present invention.

Then, using the SiN film 10 as a mask, the top surface of the first device isolation insulating film 4 and the second device isolation insulating film 5 are etched by RIE in such a manner that the height of the top surface of the first device isolation insulating film 4 and the second device isolation insulating film 5 is equal to the height of the top surface of the first electrode layer 3 (a Poly-Si surface to form a floating gate) (FIGS. 4A to 4C).

This step is performed to make the height of the areas including the periphery of the memory cell array region (not shown) and a peripheral circuit region (not shown) uniform.

Figure 5A:
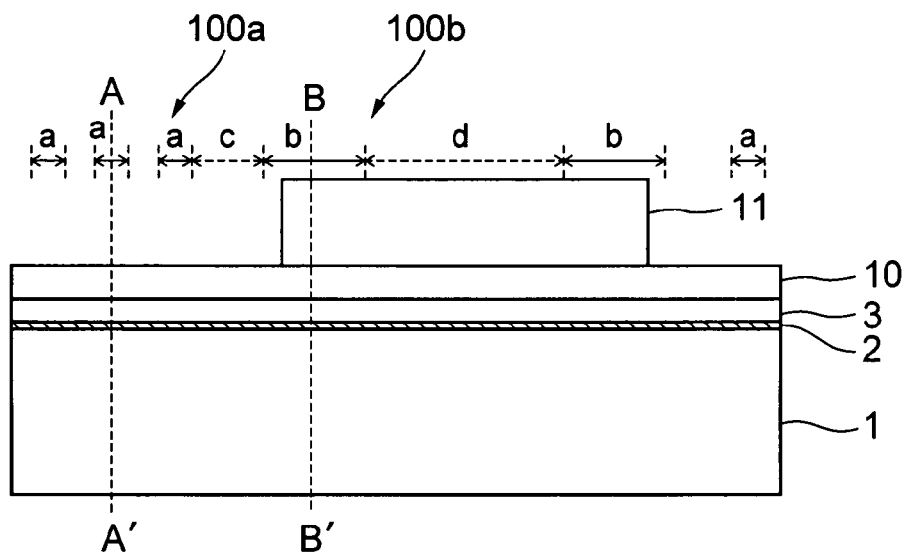
FIG. 5A is a cross-sectional view taken along the line I-I' in FIG. 1A for illustrating steps of the method of manufacturing the NAND nonvolatile semiconductor memory device 100 according to the first embodiment of the present invention.
Figure 5B:
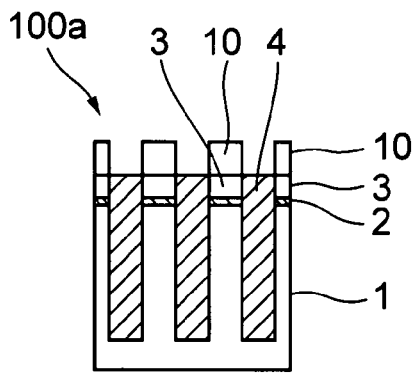
FIG. 5B is a cross-sectional view taken along the line A-A' in FIG. 5A, respectively, for illustrating the method of manufacturing the NAND nonvolatile semiconductor memory device 100 according to the first embodiment of the present invention.
Figure 5C:
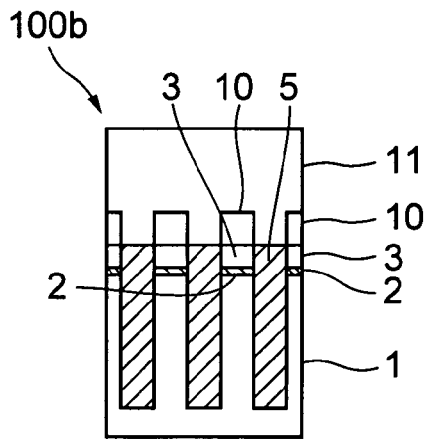
FIG. 5C is a cross-sectional view taken along the line B-B' in FIG. 5A, respectively, for illustrating the method of manufacturing the NAND nonvolatile semiconductor memory device 100 according to the first embodiment of the present invention.

Then, for further reducing the height of the top surface of the first device isolation insulating film 4 in the memory cell array region 100a by etching, a desired resist pattern is formed by lithography (FIGS. 5A to 5C). Specifically, a first resist film 11 is formed at least on the second device isolation insulating film 5.

According to this embodiment, the first resist film 11 is formed in areas "b" in which a selection gate is to be formed and spaces "d" between the selection gate areas "b" and is not formed in areas "a" in which a memory cell is to be formed and spaces "c" that are to form boundary areas between the memory cell areas and the selection gate areas.

Figure 6A:
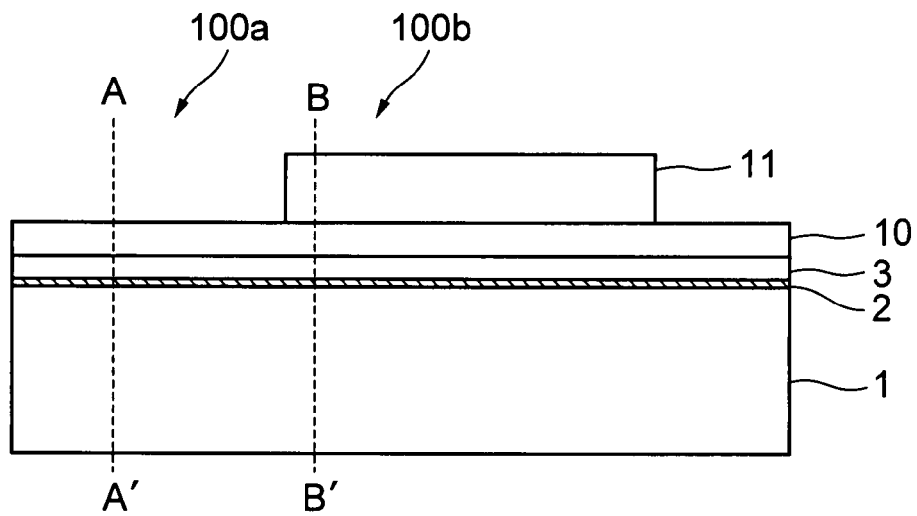
FIG. 6A is a cross-sectional view taken along the line I-I' in FIG. 1A for illustrating steps of the method of manufacturing the NAND nonvolatile semiconductor memory device 100 according to the first embodiment of the present invention.
Figure 6B:
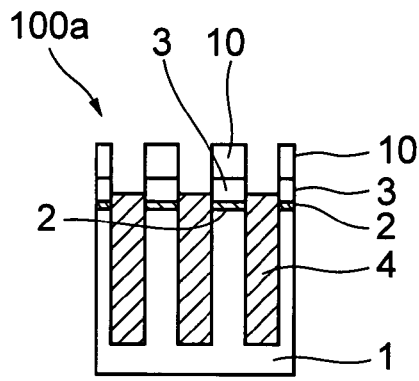
FIG. 6B is a cross-sectional view taken along the line A-A' in FIG. 6A, respectively, for illustrating the method of manufacturing the NAND nonvolatile semiconductor memory device 100 according to the first embodiment of the present invention.
Figure 6C:
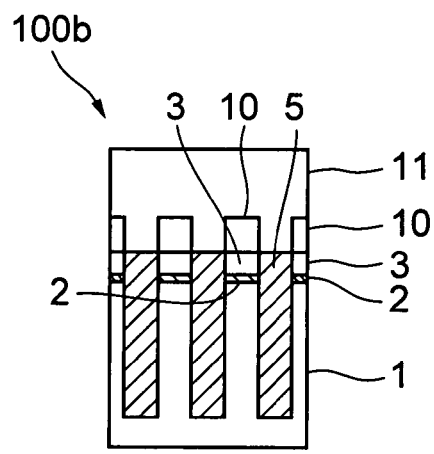
FIG. 6C is a cross-sectional view taken along the line B-B' in FIG. 6A, respectively, for illustrating the method of manufacturing the NAND nonvolatile semiconductor memory device 100 according to the first embodiment of the present invention.

Then, using the first resist film 11 as a mask, the top surface of the first device isolation insulating film 4 is selectively etched by RIE to a desired height (FIGS. 6A to 6C).

In order to achieve device isolation in such a manner that the floating gate and the control gate have desired characteristics, the height of the top surface of the first device isolation insulating film 4 from the top surface of the semiconductor layer 1 is kept equal to or higher than the height of the top surface of the gate insulating film 2 from the top surface of the semiconductor layer 1.

Figure 7A:
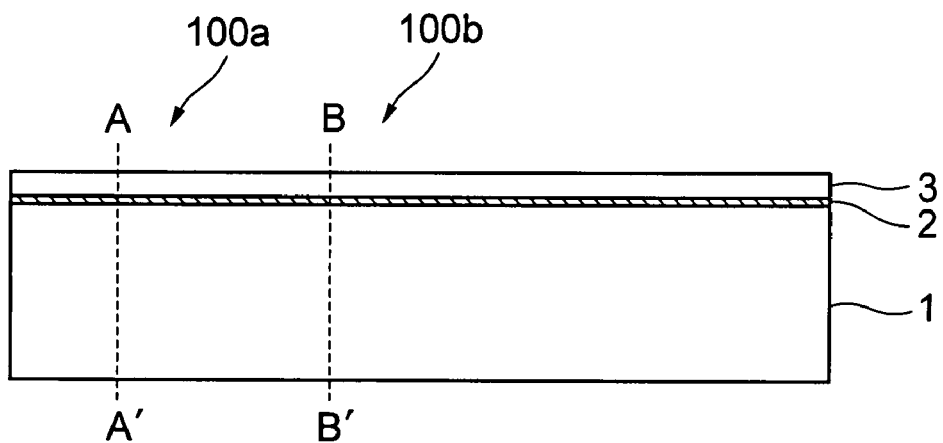
FIG. 7A is a cross-sectional view taken along the line I-I' in FIG. 1A for illustrating steps of the method of manufacturing the NAND nonvolatile semiconductor memory device 100 according to the first embodiment of the present invention.
Figure 7B:
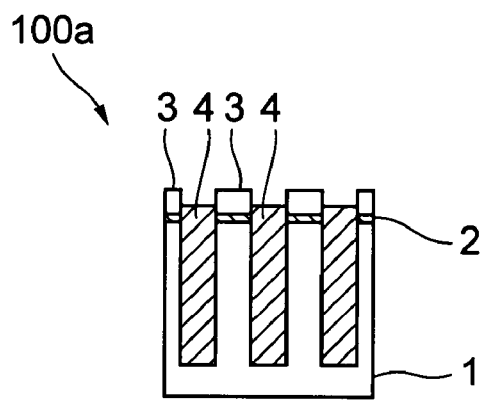
FIG. 7B is a cross-sectional view taken along the line A-A' in FIG. 7A, respectively, for illustrating the method of manufacturing the NAND nonvolatile semiconductor memory device 100 according to the first embodiment of the present invention.
Figure 7C:
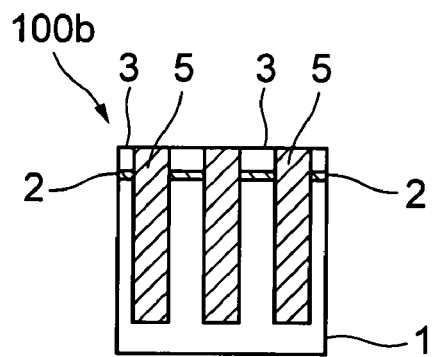
FIG. 7C is a cross-sectional view taken along the line B-B' in FIG. 7A, respectively, for illustrating the method of manufacturing the NAND nonvolatile semiconductor memory device 100 according to the first embodiment of the present invention.

Then, the first resist film 11 is removed by ashing, and the SiN film 10 used as a CMP stopper is removed with a phosphoric acid solution (FIGS. 7A to 7C).

Figure 8A:
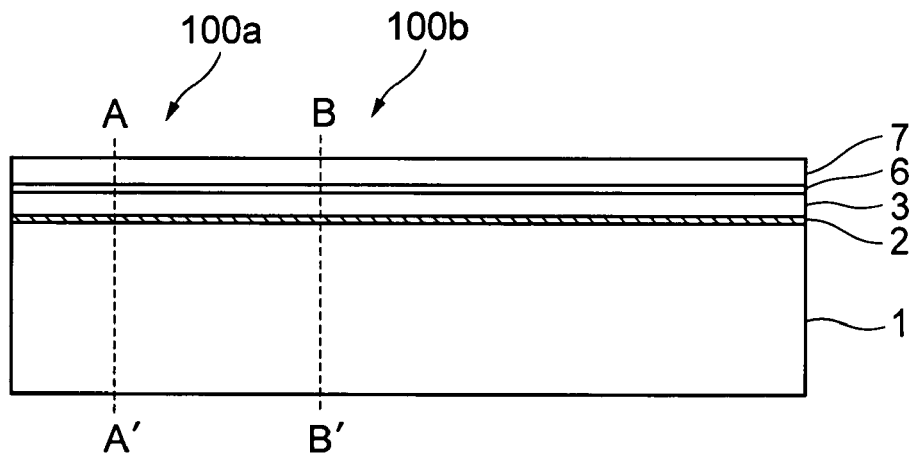
FIG. 8A is a cross-sectional view taken along the line I-I' in FIG. 1A for illustrating steps of the method of manufacturing the NAND nonvolatile semiconductor memory device 100 according to the first embodiment of the present invention.
Figure 8B:
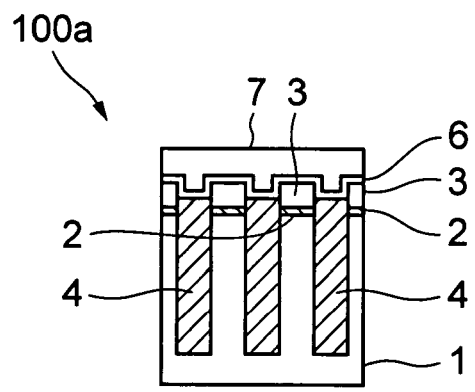
FIG. 8B is a cross-sectional view taken along the line A-A' in FIG. 8A, respectively, for illustrating the method of manufacturing the NAND nonvolatile semiconductor memory device 100 according to the first embodiment of the present invention.
Figure 8C:
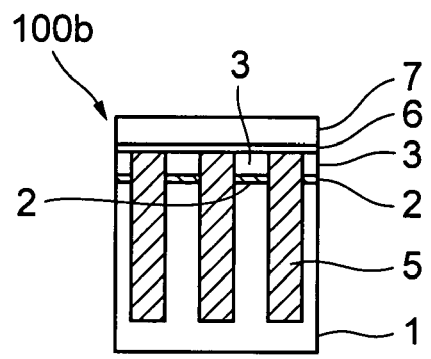
FIG. 8C is a cross-sectional view taken along the line B-B' in FIG. 8A, respectively, for illustrating the method of manufacturing the NAND nonvolatile semiconductor memory device 100 according to the first embodiment of the present invention.

Then, an interpoly insulating film 6 is formed by low pressure chemical vapor deposition (LPCVD) on the first device isolation insulating film 4, the second device isolation insulating film 5 and the exposed surface of the first electrode layer, and a second electrode layer 7 that is made of Poly-Si doped with phosphor and is to form a control gate is formed on the interpoly insulating film 6 (FIGS. 8A to 8C).

The interpoly insulating film 6 may be an oxide nitride oxide (ONO) film composed of a stack of three layers including a $SiO_2$ layer, a SiN layer and a $SiO_2$ layer, an insulating film of $Al_2O_3$ or the like having a high dielectric constant, or a stack thereof.

Figure 9A:
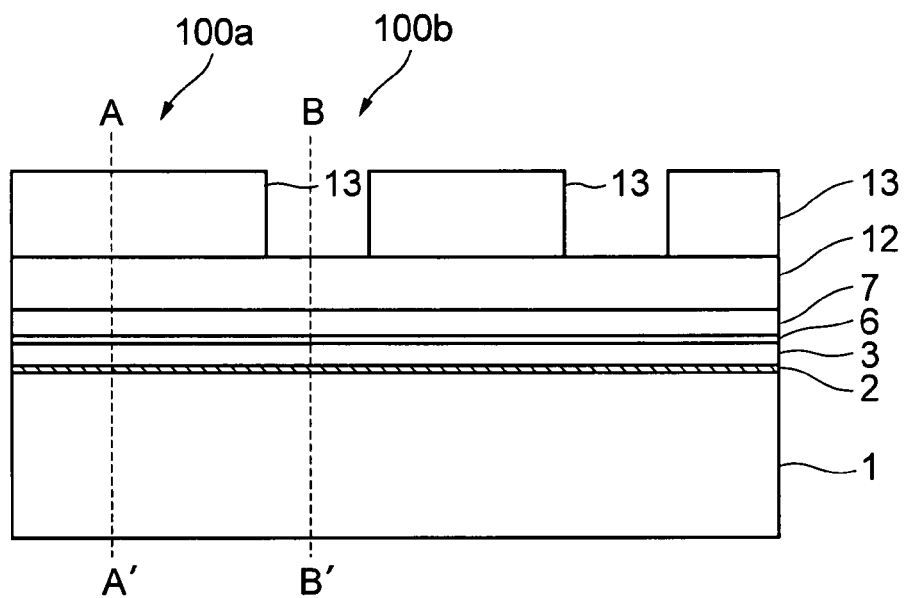
FIG. 9A is a cross-sectional view taken along the line I-I' in FIG. 1A for illustrating steps of the method of manufacturing the NAND nonvolatile semiconductor memory device 100 according to the first embodiment of the present invention.
Figure 9B:
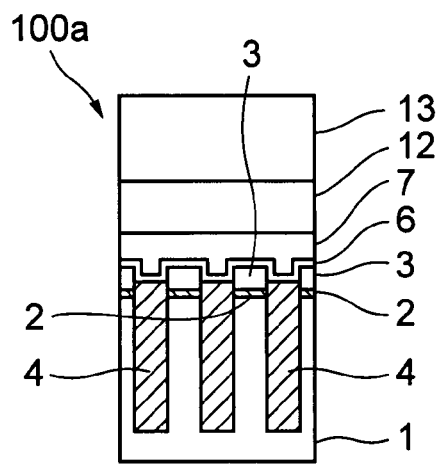
FIG. 9B is a cross-sectional view taken along the line A-A' in FIG. 9A, respectively, for illustrating the method of manufacturing the NAND nonvolatile semiconductor memory device 100 according to the first embodiment of the present invention.
Figure 9C:
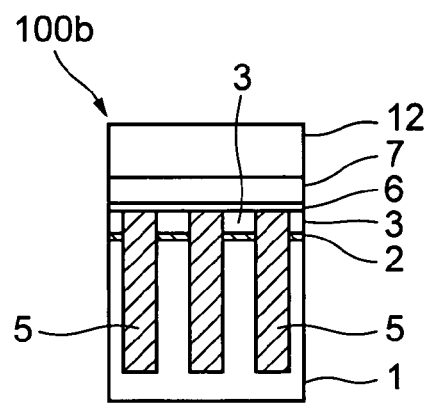
FIG. 9C is a cross-sectional view taken along the line B-B' in FIG. 9A, respectively, for illustrating the method of manufacturing the NAND nonvolatile semiconductor memory device 100 according to the first embodiment of the present invention.

Then, a $SiO_2$ film 12 doped with boron as an impurity is formed on the second electrode layer 7 by LPCVD. Then, a second resist film 13 is formed by lithography on the memory cell array region 100a and the spaces between the selection gates on the $SiO_2$ film 12 (FIGS. 9A to 9C).

Figure 10A:
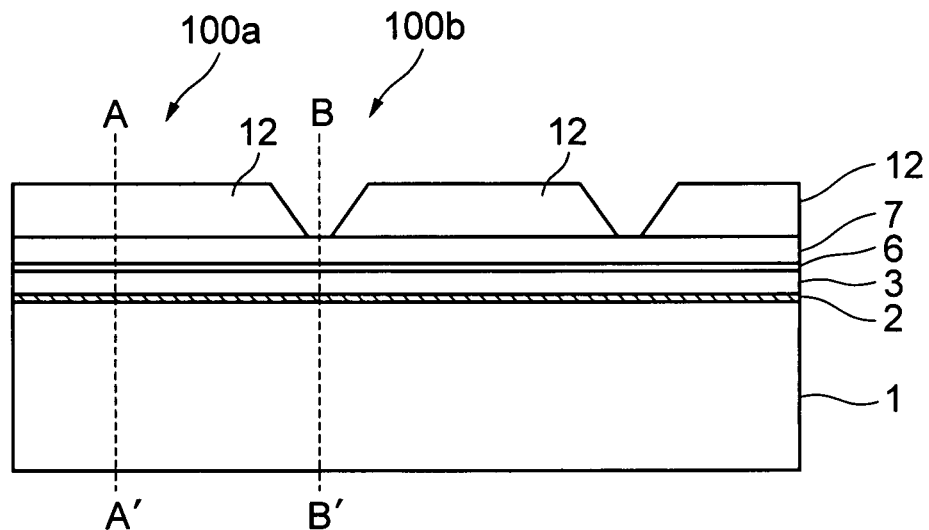
FIG. 10A is a cross-sectional view taken along the line I-I' in FIG. 1A for illustrating steps of the method of manufacturing the NAND nonvolatile semiconductor memory device 100 according to the first embodiment of the present invention.
Figure 10B:
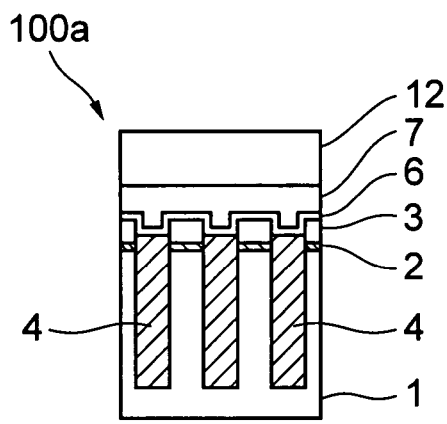
FIG. 10B is a cross-sectional view taken along the line A-A' in FIG. 10A, respectively, for illustrating the method of manufacturing the NAND nonvolatile semiconductor memory device 100 according to the first embodiment of the present invention.
Figure 10C:
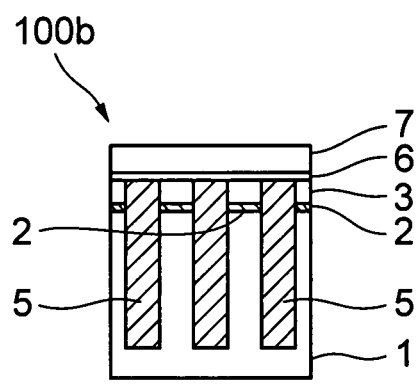
FIG. 10C is a cross-sectional view taken along the line B-B' in FIG. 10A, respectively, for illustrating the method of manufacturing the NAND nonvolatile semiconductor memory device 100 according to the first embodiment of the present invention.

Then, using the second resist film 13 as a mask, the $SiO_2$ film 12 is selectively etched by RIE (FIGS. 10A to 10C). In this embodiment, the $SiO_2$ film 12 is tapered by design so that the second electrode layer 7 is etched over a range narrower than the width of the selection gates to be formed.

Figure 11A:
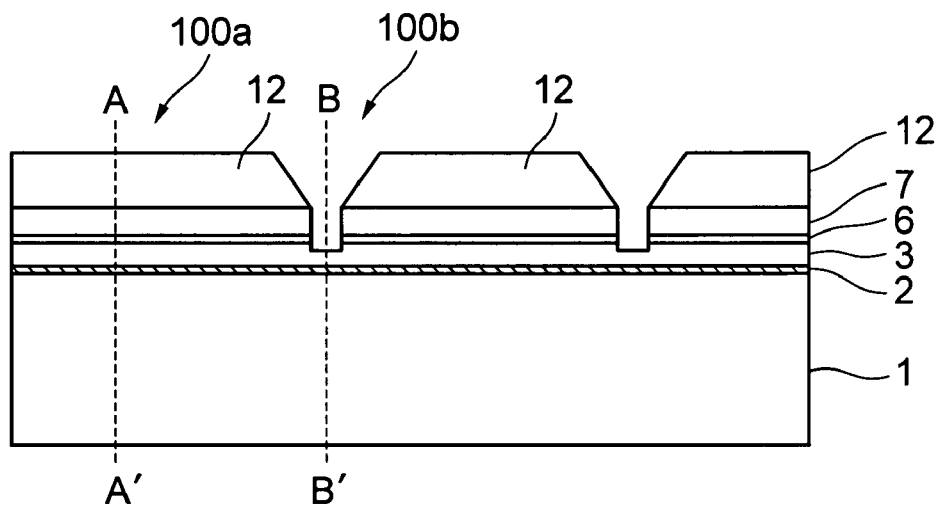
FIG. 11A is a cross-sectional view taken along the line I-I' in FIG. 1A for illustrating steps of the method of manufacturing the NAND nonvolatile semiconductor memory device 100 according to the first embodiment of the present invention.
Figure 11B:
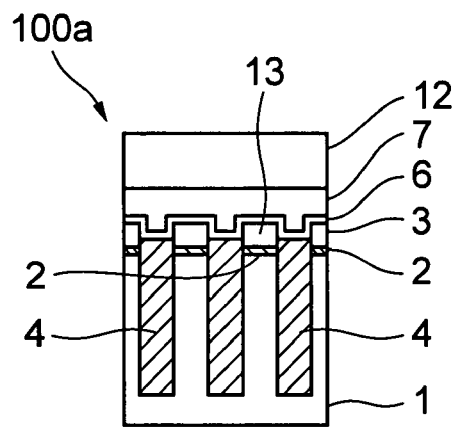
FIG. 11B is a cross-sectional view taken along the line A-A' in FIG. 11A, respectively, for illustrating the method of manufacturing the NAND nonvolatile semiconductor memory device 100 according to the first embodiment of the present invention.
Figure 11C:
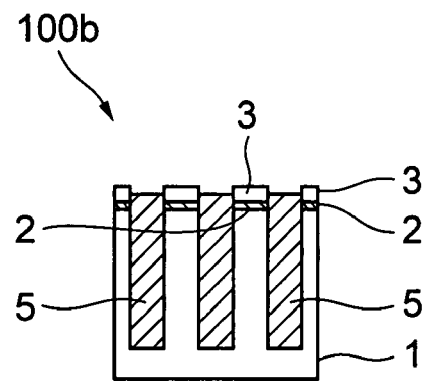
FIG. 11C is a cross-sectional view taken along the line B-B' in FIG. 11A, respectively, for illustrating the method of manufacturing the NAND nonvolatile semiconductor memory device 100 according to the first embodiment of the present invention.

Then, after the second resist film 13 is removed, the interpoly insulating film 6 and the second electrode layer (Poly-Si film) 7 in the selection gate region 100b are selectively etched by RIE using the remaining $SiO_2$ film 12 as a mask. In this way, the top surface of the second device isolation insulating film 5 and the top surface of the first electrode layer 3 are exposed (FIGS. 11A to 11C).

The interpoly insulating film 6 in the selection gate region 100b is removed in this way, and a conductive layer is embedded in the space left after the interpoly insulating layer 6 is removed. Thus, the floating gate and the control gate can be made electrically continuous.

In order to ensure the continuity between the first electrode layer 3 and a third electrode layer 8, the top surface of the first electrode layer 3 (Poly-Si film) is also slightly etched.

Figure 12A:
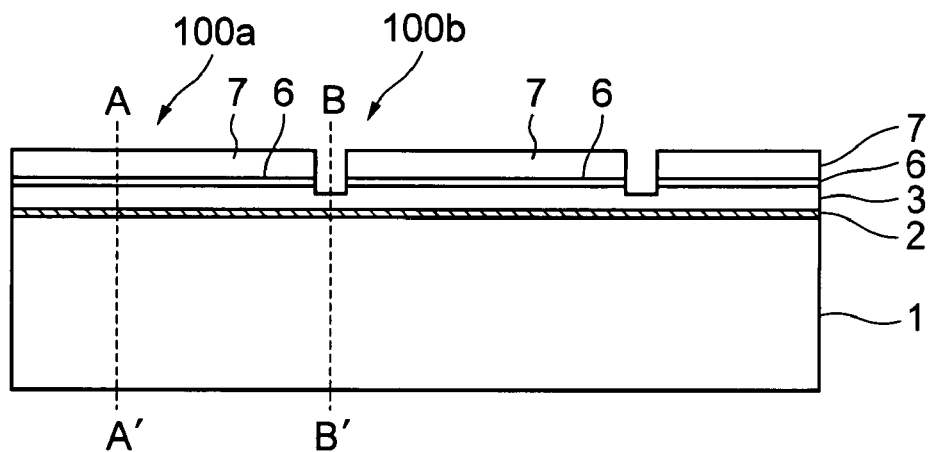
FIG. 12A is a cross-sectional view taken along the line I-I' in FIG. 1A for illustrating steps of the method of manufacturing the NAND nonvolatile semiconductor memory device 100 according to the first embodiment of the present invention.
Figure 12B:
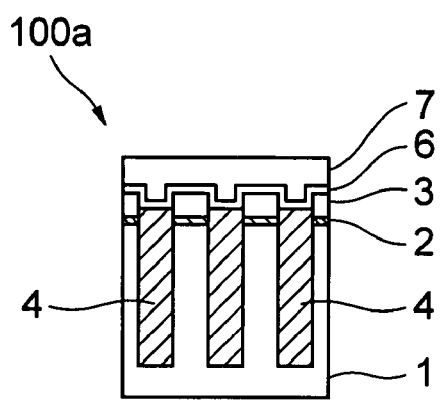
FIG. 12B is a cross-sectional view taken along the line A-A' in FIG. 12A, respectively, for illustrating the method of manufacturing the NAND nonvolatile semiconductor memory device 100 according to the first embodiment of the present invention.
Figure 12C:
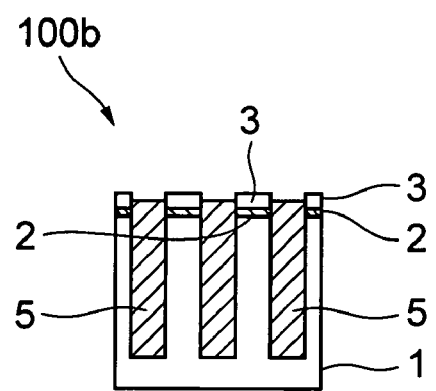
FIG. 12C is a cross-sectional view taken along the line B-B' in FIG. 12A, respectively, for illustrating the method of manufacturing the NAND nonvolatile semiconductor memory device 100 according to the first embodiment of the present invention.

Then, using a mixture solution of hydrofluoric acid and sulfuric acid, the $SiO_2$ film 12 is selectively removed with the second device isolation insulating film 5 remaining unprocessed (FIGS. 12A to 12C).

Figure 13A:
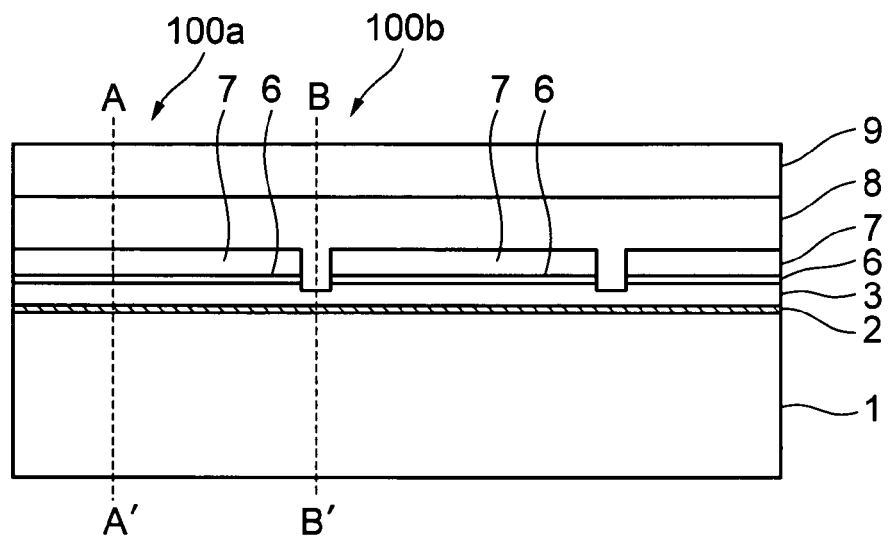
FIG. 13A is a cross-sectional view taken along the line I-I' in FIG. 1A for illustrating steps of the method of manufacturing the NAND nonvolatile semiconductor memory device 100 according to the first embodiment of the present invention.
Figure 13B:
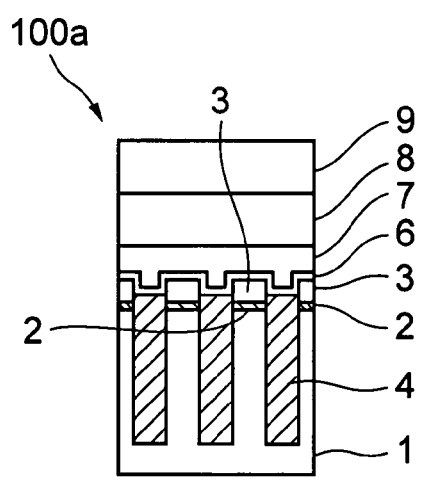
FIG. 13B is a cross-sectional view taken along the line A-A' in FIG. 13A, respectively, for illustrating the method of manufacturing the NAND nonvolatile semiconductor memory device 100 according to the first embodiment of the present invention.
Figure 13C:
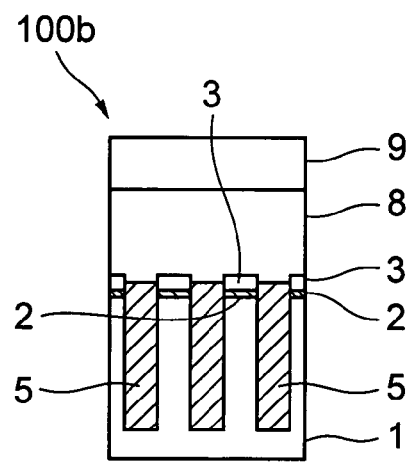
FIG. 13C is a cross-sectional view taken along the line B-B' in FIG. 13A, respectively, for illustrating the method of manufacturing the NAND nonvolatile semiconductor memory device 100 according to the first embodiment of the present invention.

Then, the third electrode layer 8 is formed by LPCVD on the second electrode layer 7, the second device isolation insulating film 5, and the first electrode layer 3. Then, a SiN film 9 that serves as a mask when processing the gates is deposited on the third electrode layer 8 (FIGS. 13A to 13C).

As described above, the third electrode layer 8 is a Poly-Si film doped with phosphor, for example.

Figure 14A:
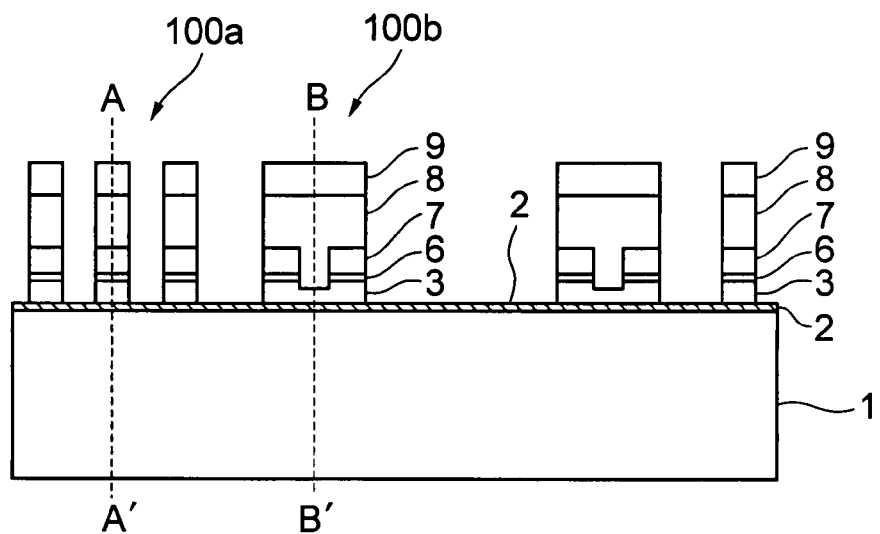
FIG. 14A is a cross-sectional view taken along the line I-I' in FIG. 1A for illustrating steps of the method of manufacturing the NAND nonvolatile semiconductor memory device 100 according to the first embodiment of the present invention.
Figure 14B:
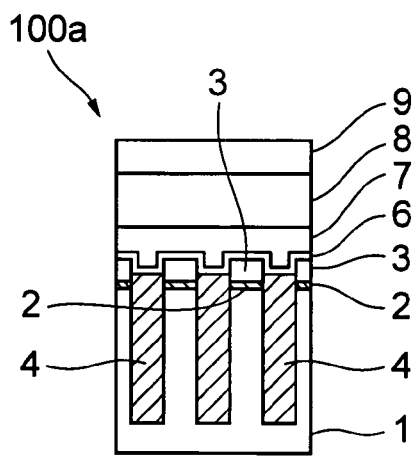
FIG. 14B is a cross-sectional view taken along the line A-A' in FIG. 14A, respectively, for illustrating the method of manufacturing the NAND nonvolatile semiconductor memory device 100 according to the first embodiment of the present invention.
Figure 14C:
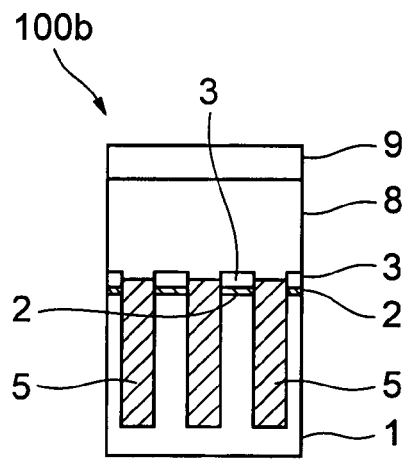
FIG. 14C is a cross-sectional view taken along the line B-B' in FIG. 14A, respectively, for illustrating the method of manufacturing the NAND nonvolatile semiconductor memory device 100 according to the first embodiment of the present invention.

Then, a resist film (not shown) having a desired pattern is formed by lithography, the SiN film 9 is etched by RIE, and then the resist film is removed. Then, using the etched SiN film 9 as a mask, the first electrode layer 3, the interpoly insulating film 6, the second electrode layer 7 and the third electrode layer 8 are selectively removed by RIE (FIGS. 14A to 14C).

Thus, the control gate constituted by the first electrode layer 3 and the floating gate constituted by the second electrode layer 7 and the third electrode layer 8 can be formed in the memory cell array region 100a. Furthermore, the selection gates constituted by the first electrode layer 3, the second electrode layer 7 and the third electrode layer 8 can be formed in the selection gate region 100b.

As described above, during manufacture of the NAND nonvolatile semiconductor memory device 100, the height of the top surface of the first device isolation insulating film 4 in the memory cell array region 100a is not changed, but the height of the top surface of the second device isolation insulating film 5 in the selection gate region 100b is previously increased. In other words, the height of the top surface of the second device isolation insulating film 5 is determined taking into account variations in etching amount due to variations in the manufacturing process.

As a result, even if the second device isolation insulating film 5 is excessively etched, the top surface of the second device isolation insulating film 5 is higher than the top surface of the gate insulating film 2, and therefore, adequate device isolation can be achieved.

As described above, for the NAND nonvolatile semiconductor memory device and the method of manufacturing the NAND nonvolatile semiconductor memory device according to this embodiment, the selection gate can have more stable structure, and the yield can be improved.

SECOND EMBODIMENT

According to the first embodiment, as shown in FIGS. 5A to 5C, a desired resist pattern is formed by lithography in order to reduce the height of the top surface of the first device isolation insulating film in the memory cell array region by etching.

The resist pattern is not limited to that according to the first embodiment, and it is essential only that the first resist film is formed at least on the second device isolation insulating film. In other words, any resist pattern may be formed as far as the height of the device isolation insulating film is not reduced in the part of the selection gate region where the interpoly insulating film is removed.

Therefore, the resist pattern is configured taking into account the misalignment between the lower layers and the upper layers, the width of the memory cells, the width of the selection gates, the arrangement thereof, the distance therebetween, and the layout area effect.

With regard to a second embodiment, another example of the resist pattern will be described.

Figure 15A:
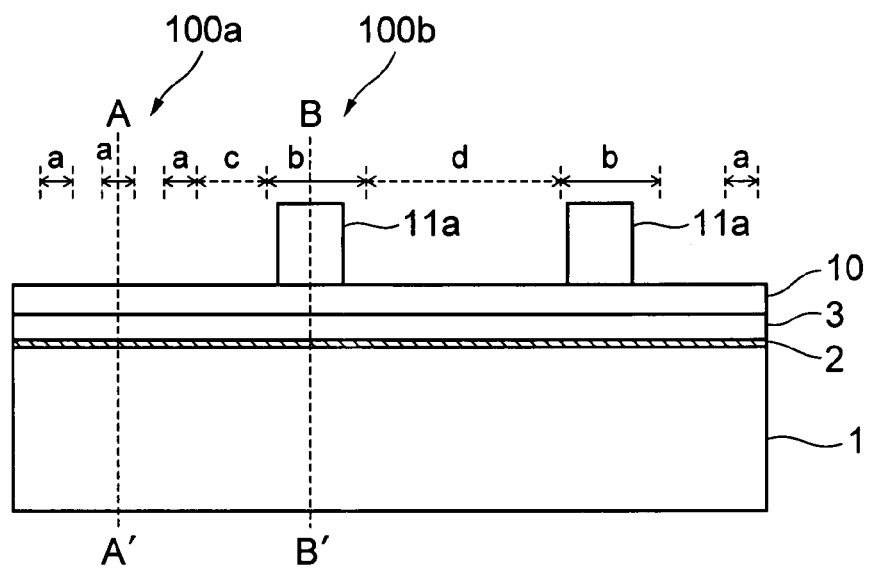
FIG. 15A is a cross-sectional view taken along the line I-I' in FIG. 1A for illustrating steps of the method of manufacturing the NAND nonvolatile semiconductor memory device 100 according to a second embodiment of the present invention.
Figure 15B:
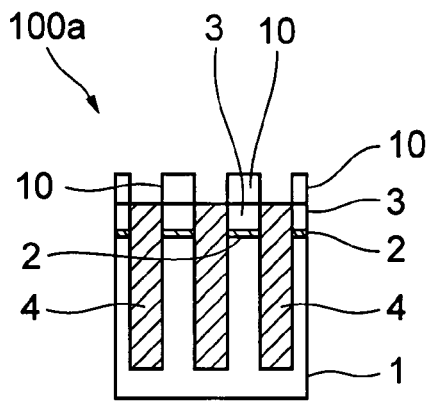
FIG. 15B is a cross-sectional view taken along the line A-A' in FIG. 15A, respectively, for illustrating the method of manufacturing the NAND nonvolatile semiconductor memory device 100 according to the second embodiment of the present invention.
Figure 15C:
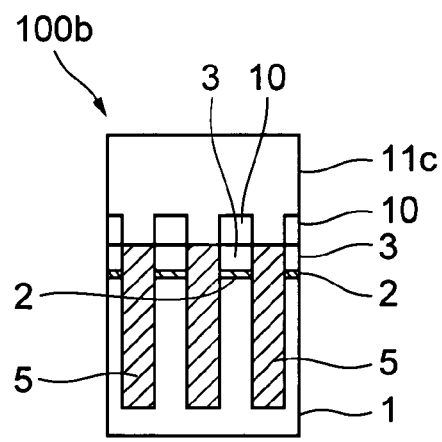
FIG. 15C is a cross-sectional view taken along the line B-B' in FIG. 15A, respectively, for illustrating the method of manufacturing the NAND nonvolatile semiconductor memory device 100 according to the second embodiment of the present invention.

FIG. 15A is a cross-sectional view taken along the line I-I' in FIG. 1A for illustrating steps of a method of manufacturing a NAND nonvolatile semiconductor memory device 100 according to the second embodiment of the present invention. FIG. 15B is a cross-sectional view taken along the line A-A' in FIG. 15A for illustrating the method of manufacturing the NAND nonvolatile semiconductor memory device 100 according to the second embodiment of the present invention. FIG. 15C is a cross-sectional view taken along the line B-B' in FIG. 15A for illustrating the method of manufacturing the NAND nonvolatile semiconductor memory device 100 according to the second embodiment of the present invention. In these drawings, the same reference numerals as those in the first embodiment denote the same component as those in the first embodiment.

As shown in FIGS. 15A to 15C, a desired resist pattern is formed by lithography in order to reduce the height of the top surface of a first device isolation insulating film 4 in a memory cell array region 100a by etching. Specifically, a first resist film 11a is formed at least on a second device isolation insulating film 5.

According to this embodiment, the first resist film 11a is formed in areas "b" in which a selection gate is to be formed. The first resist film 11a is not formed in areas "a" in which a memory cell is to be formed, spaces "c" that are to form boundary areas between the memory cell areas and the selection gate areas, and spaces "d" between the selection gate areas.

In the method of manufacturing the NAND nonvolatile semiconductor memory device according to the second embodiment, the steps shown in FIGS. 3, 4, and 6 to 14 described with regard to the first embodiment are carried out in the same way.

Thus, as in the first embodiment, for the NAND nonvolatile semiconductor memory device and the method of manufacturing the NAND nonvolatile semiconductor memory device according to this embodiment, the selection gate can have more stable structure, and the yield can be improved.

THIRD EMBODIMENT

According to the second embodiment, a desired resist pattern different from that described with regard to the first embodiment is formed by lithography in order to reduce the height of the top surface of the first device isolation insulating film in the memory cell array region by etching.

With regard to a third embodiment, a resist pattern different from those according to the embodiments 1 and 2 will be described.

Figure 16A:
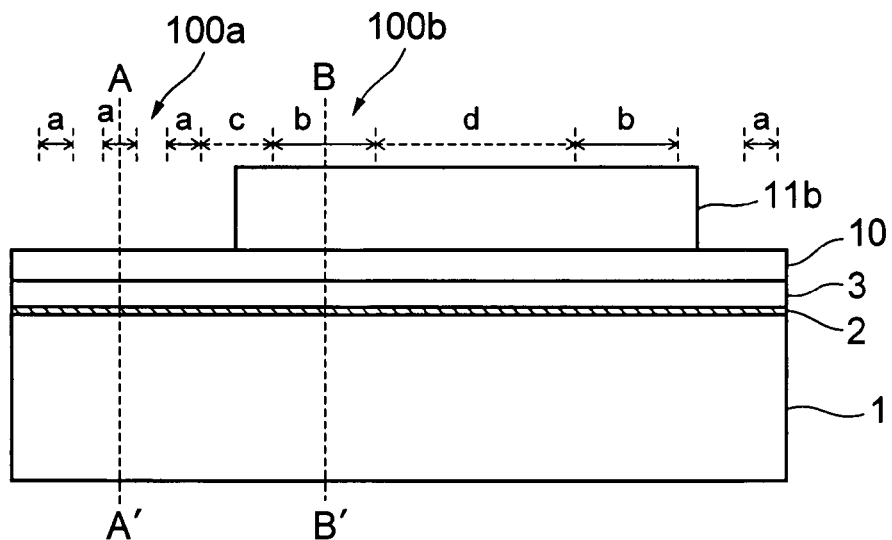
FIG. 16A is a cross-sectional view taken along the line I-I' in FIG. 1A for illustrating steps of the method of manufacturing the NAND nonvolatile semiconductor memory device 100 according to a third embodiment of the present invention.
Figure 16B:
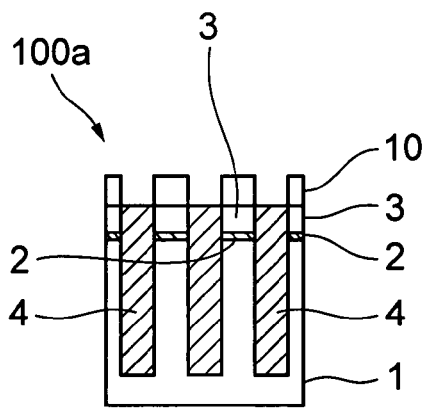
FIG. 16B is a cross-sectional view taken along the line A-A' in FIG. 16A, respectively, for illustrating the method of manufacturing the NAND nonvolatile semiconductor memory device 100 according to the third embodiment of the present invention.
Figure 16C:
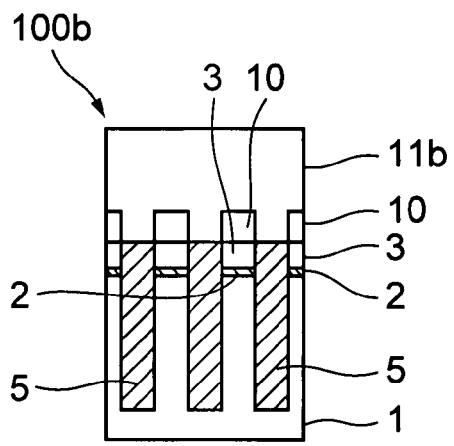
FIG. 16C is a cross-sectional view taken along the line B-B' in FIG. 16A, respectively, for illustrating the method of manufacturing the NAND nonvolatile semiconductor memory device 100 according to the third embodiment of the present invention.

FIG. 16A is a cross-sectional view taken along the line I-I' in FIG. 1A for illustrating steps of a method of manufacturing a NAND nonvolatile semiconductor memory device 100 according to the third embodiment of the present invention. FIG. 16B is a cross-sectional view taken along the line A-A' in FIG. 16A for illustrating the method of manufacturing the NAND nonvolatile semiconductor memory device 100 according to the third embodiment of the present invention. FIG. 16C is a cross-sectional view taken along the line B-B' in FIG. 16A for illustrating the method of manufacturing the NAND nonvolatile semiconductor memory device 100 according to the third embodiment of the present invention. In these drawings, the same reference numerals as those in the first embodiment denote the same component as those in the first embodiment.

As shown in FIGS. 16A to 16C, a desired resist pattern is formed by lithography in order to reduce the height of the top surface of a first device isolation insulating film 4 in a memory cell array region 100a by etching. Specifically, a first resist film 11b is formed at least on a second device isolation insulating film 5.

According to this embodiment, the first resist film 11b is formed in areas "b" in which a selection gate is to be formed, parts of spaces "c" that are to form boundary areas between memory cell areas and the selection gate areas, and spaces "d" between the selection gate areas. The first resist film 11b is not formed in areas "a" in which a memory cell is to be formed.

In the method of manufacturing the NAND nonvolatile semiconductor memory device according to the third embodiment, the steps shown in FIGS. 3, 4, and 6 to 14 described with regard to the first embodiment are carried out in the same way.

Thus, as in the first embodiment, for the NAND nonvolatile semiconductor memory device and the method of manufacturing the NAND nonvolatile semiconductor memory device according to this embodiment, the selection gate can have more stable structure, and the yield can be improved.

FOURTH EMBODIMENT

As described above, according to the embodiments 2 and 3, a desired resist pattern different from that described with regard to the first embodiment is formed by lithography in order to reduce the height of the top surface of the first device isolation insulating film in the memory cell array region by etching.

With regard to a fourth embodiment, a resist pattern different from those according to the embodiments described earlier will be described.

Figure 17A:
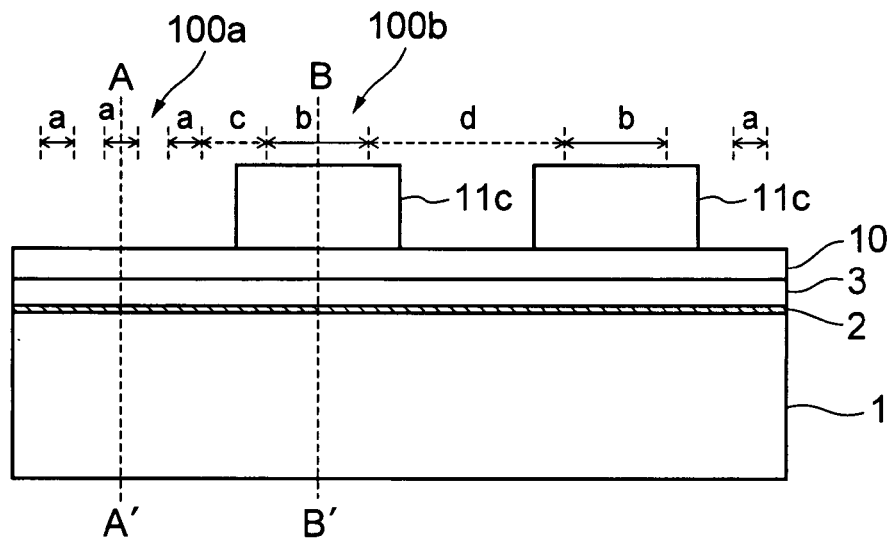
FIG. 17A is a cross-sectional view taken along the line I-I' in FIG. 1A for illustrating steps of the method of manufacturing the NAND nonvolatile semiconductor memory device 100 according to a fourth embodiment of the present invention.
Figure 17B:
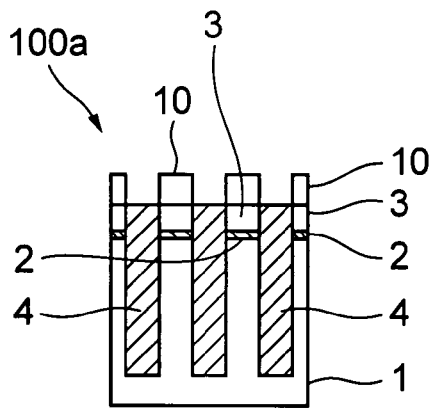
FIG. 17B is a cross-sectional view taken along the line A-A' in FIG. 17A, respectively, for illustrating the method of manufacturing the NAND nonvolatile semiconductor memory device 100 according to the fourth embodiment of the present invention.
Figure 17C:
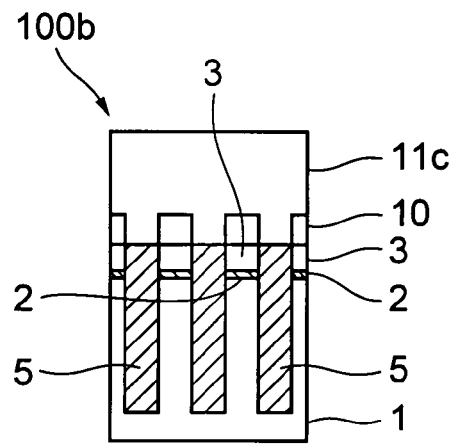
FIG. 17C is a cross-sectional view taken along the line B-B' in FIG. 17A, respectively, for illustrating the method of manufacturing the NAND nonvolatile semiconductor memory device 100 according to the fourth embodiment of the present invention.

FIG. 17A is a cross-sectional view taken along the line I-I' in FIG. 1A for illustrating steps of a method of manufacturing a NAND nonvolatile semiconductor memory device 100 according to the fourth embodiment of the present invention. FIG. 17B is a cross-sectional view taken along the line A-A' in FIG. 17A for illustrating the method of manufacturing the NAND nonvolatile semiconductor memory device 100 according to the fourth embodiment of the present invention. FIG. 17C is a cross-sectional view taken along the line B-B' in FIG. 17A for illustrating the method of manufacturing the NAND nonvolatile semiconductor memory device 100 according to the fourth embodiment of the present invention. In these drawings, the same reference numerals as those in the first embodiment denote the same component as those in the first embodiment.

As shown in FIGS. 17A to 17C, a desired resist pattern is formed by lithography in order to reduce the height of the top surface of a first device isolation insulating film 4 in a memory cell array region 100a by etching. Specifically, a first resist film 11c is formed at least on a second device isolation insulating film 5.

According to this embodiment, the first resist film 11c is formed in areas "b" in which a selection gate is to be formed, parts of spaces "c" that are to form boundary areas between memory cell areas and the selection gate areas, and parts of spaces "d" between the selection gate areas. The first resist film 11c is not formed in areas "a" in which a memory cell is to be formed and parts of spaces "d" between the selections gate areas that are at a distance from the selection gate areas "b".

In the method of manufacturing the NAND nonvolatile semiconductor memory device according to the fourth embodiment, the steps shown in FIGS. 3, 4, and 6 to 14 described with regard to the first embodiment are carried out in the same way.

Thus, as in the first embodiment, for the NAND nonvolatile semiconductor memory device and the method of manufacturing the NAND nonvolatile semiconductor memory device according to this embodiment, the selection gate can have more stable structure, and the yield can be improved.

FIFTH EMBODIMENT

As described above, according to the first embodiment, as shown in FIGS. 9A to 9C, a desired resist pattern is formed by lithography in order to etch the top surface of the interpoly insulating film in the selection gate region.

The resist pattern is not limited to that according to the first embodiment, and it is essential only that the second resist film is formed at least on the $SiO_2$ film in the memory cell array region. In other words, it is essential only that the $SiO_2$ film can be selectively etched by RIE using the second resist film as a mask, and the interpoly insulating film and the second electrode layer in the selection gate region can be selectively etched using the remaining $SiO_2$ film as a mask.

Therefore, the resist pattern is configured taking into account the misalignment between the lower layers and the upper layers, the width of the memory cells, the width of the selection gates, the arrangement thereof, the distance therebetween, and the layout area effect.

With regard to a fifth embodiment, another example of the resist pattern will be described.

Figure 18A:
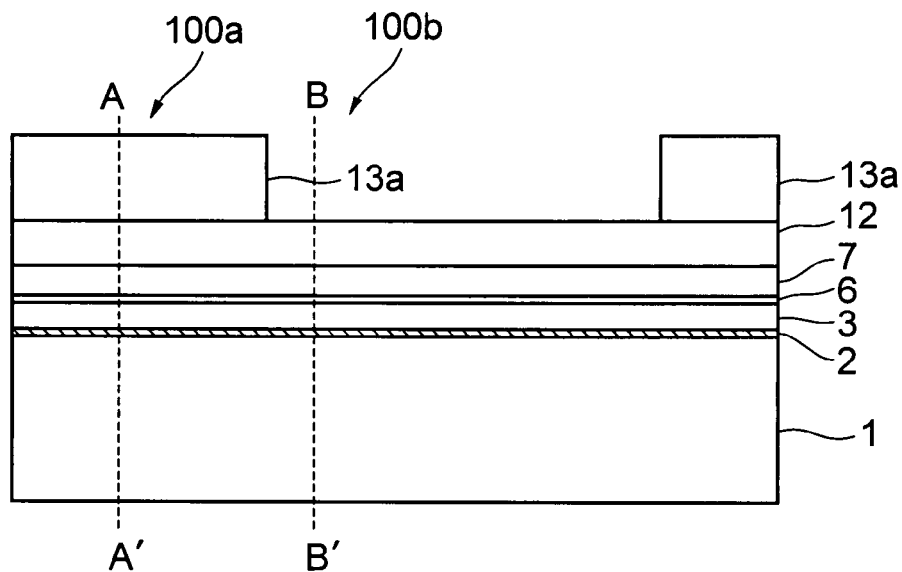
FIG. 18A is a cross-sectional view taken along the line I-I' in FIG. 1A for illustrating steps of the method of manufacturing the NAND nonvolatile semiconductor memory device 100 according to a fifth embodiment of the present invention.
Figure 18B:
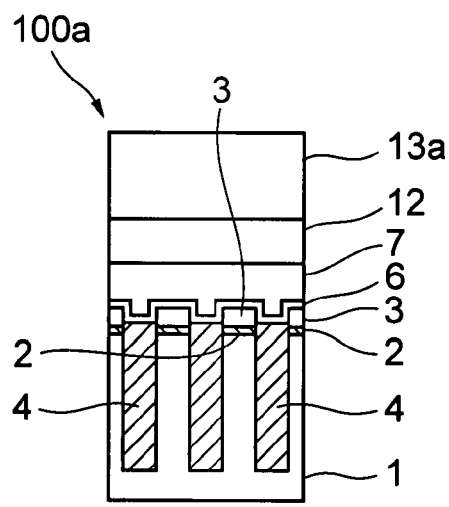
FIG. 18B is a cross-sectional view taken along the line A-A' in FIG. 18A, respectively, for illustrating the method of manufacturing the NAND nonvolatile semiconductor memory device 100 according to the fifth embodiment of the present invention.
Figure 18C:
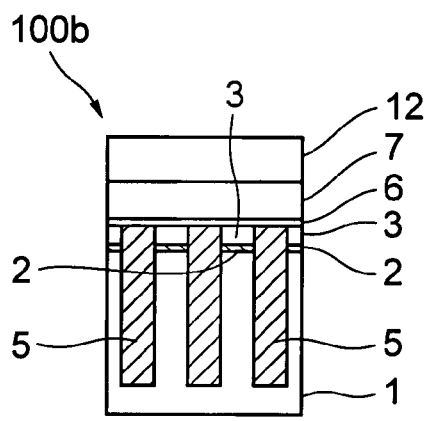
FIG. 18C is a cross-sectional view taken along the line B-B' in FIG. 18A, respectively, for illustrating the method of manufacturing the NAND nonvolatile semiconductor memory device 100 according to the fifth embodiment of the present invention.

FIG. 18A is a cross-sectional view taken along the line I-I' in FIG. 1A for illustrating steps of a method of manufacturing a NAND nonvolatile semiconductor memory device 100 according to the fifth embodiment of the present invention. FIG. 18B is a cross-sectional view taken along the line A-A' in FIG. 18A for illustrating the method of manufacturing the NAND nonvolatile semiconductor memory device 100 according to the fifth embodiment of the present invention. FIG. 18C is a cross-sectional view taken along the line B-B' in FIG. 18A for illustrating the method of manufacturing the NAND nonvolatile semiconductor memory device 100 according to the fifth embodiment of the present invention. In these drawings, the same reference numerals as those in the first embodiment denote the same component as those in the first embodiment.

In the method of manufacturing the NAND nonvolatile semiconductor memory device according to the fifth embodiment, the steps shown in FIGS. 3 to 8, and 10 to 14 described with regard to the first embodiment are carried out in the same way.

As shown in FIGS. 18A to 18C, a $SiO_2$ film 12 doped with boron as an impurity is formed on a second electrode layer 7 by LPCVD. Then, a second resist film 13a is formed on the $SiO_2$ film 12 in a memory cell array region 100a by lithography.

After that, as in the first embodiment, using the second resist film 13a as a mask, the $SiO_2$ film 12 is selectively etched by RIE. Then, after the second resist film 13a is removed, an interpoly insulating film 6 and the second electrode layer 7 in a selection gate region 100b are selectively etched using the remaining $SiO_2$ film 12 as a mask, thereby exposing the top surface of a second device isolation insulating film 5 and the top surface of a first electrode layer 3.

Thus, as in the first embodiment, for the NAND nonvolatile semiconductor memory device and the method of manufacturing the NAND nonvolatile semiconductor memory device according to this embodiment, the selection gate can have more stable structure, and the yield can be improved.

In the embodiments described above, the first electrode layer (Poly-Si film) that is to form floating gates and selection gates is formed before the first and second device isolation insulating films are formed. However, the present invention can be equally applied to a case where the first electrode layer is formed after the first and second device isolation insulating film are formed.

The present invention is not limited to the embodiments described above, and various modifications can be made without departing form the scope and spirit of the present invention when implementing the present invention.

Furthermore, the embodiments described above involve inventions in various stages, and various inventions can be derived by appropriately combining a plurality of constituent features disclosed herein. For example, if the problems to be solved by the invention can be attained, and the advantage of the present invention can be provided when some of the constituent features described with regard to the embodiments are omitted, the arrangement from which those constituent features are omitted can be derived as an invention.

What is claimed is:

1. A NAND nonvolatile semiconductor memory device that has a memory cell array region and a selection gate region, comprising:
   a semiconductor layer;
   a gate insulating film disposed on said semiconductor layer;
   a plurality of first electrode layers selectively disposed on said gate insulating film;
   a first device isolation insulating film formed in said memory cell array region and extends from between said adjacent first electrode layers into said semiconductor layer for device isolation;
   a second device isolation insulating film formed in said selection gate region and extends from between said adjacent first electrode layers into said semiconductor layer for device isolation;
   an interpoly insulating film formed at least on the top of said first electrode layers and said first device isolation insulating film in said memory cell array region;
   a second electrode layer disposed on said interpoly insulating film; and
   a third electrode layer disposed on said second electrode layer, said second device isolation insulating film and the first electrode layers in said selection gate region,
   wherein the height of the top surface of said second device isolation insulating film is greater than the height of the top surface of said first device isolation insulating film.

2. The NAND nonvolatile semiconductor memory device according to claim 1, wherein the height of the top surface of said second device isolation insulating film from the top surface of said semiconductor layer is twice or more the height of the top surface of said gate insulating film in the selection gate region from the top surface of said semiconductor layer, and equal to or less than the height of the top surface of said first electrode layers in said selection gate region from the top surface of the semiconductor layer.

3. A method of manufacturing a NAND nonvolatile semiconductor memory device that has a memory cell array region and a selection gate region, comprising:
   forming a gate insulating film disposed on a semiconductor layer;
   forming a plurality of first electrode layers selectively disposed on said gate insulating film;
   forming a first device isolation insulating film in said memory cell array region that extends from between said adjacent first electrode layers into said semiconductor layer for device isolation;
   forming a second device isolation insulating film in said selection gate region that extends from between said adjacent first electrode layers into said semiconductor layer for device isolation;
   forming an interpoly insulating film at least on the top of said first electrode layers and said first device isolation insulating film in said memory cell array region;
   forming a second electrode layer disposed on said interpoly insulating film; and
   forming a third electrode layer disposed on said second electrode layer, said second device isolation insulating film and said first electrode layer formed in said selection gate region;
   wherein the height of the top surface of said second device isolation insulating film is greater than the height of the top surface of said first device isolation insulating film.

4. The method of manufacturing a NAND nonvolatile semiconductor memory device according to claim 3, wherein the height of the top surface of said second device isolation insulating film is twice or more the height of the top surface of said gate insulating film in the selection gate region from the top surface of said semiconductor layer, and equal to or less than the height of the top surface of said first electrode layers in said selection gate region from the top surface of the semiconductor layer.

* * * * *